United States Patent
Kultgen et al.

(10) Patent No.: US 9,182,428 B2
(45) Date of Patent: Nov. 10, 2015

(54) SWITCHED CAPACITANCE VOLTAGE DIFFERENTIAL SENSING CIRCUIT WITH NEAR INFINITE INPUT IMPEDANCE

(75) Inventors: Michael Alfred Kultgen, Colorado Springs, CO (US); David Hutchinson, Mountain View, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 675 days.

(21) Appl. No.: 13/457,320

(22) Filed: Apr. 26, 2012

(65) Prior Publication Data

US 2012/0274360 A1    Nov. 1, 2012

Related U.S. Application Data

(60) Provisional application No. 61/480,915, filed on Apr. 29, 2011.

(51) Int. Cl.

| *G01N 27/416* | (2006.01) |
| *G01R 19/00* | (2006.01) |
| *G01R 19/10* | (2006.01) |
| *H03F 3/45* | (2006.01) |
| *G01R 19/165* | (2006.01) |
| *G01R 31/36* | (2006.01) |

(52) U.S. Cl.
CPC ............ *G01R 19/0023* (2013.01); *G01R 19/10* (2013.01); *H03F 3/45475* (2013.01); *H03F 3/45941* (2013.01); *G01R 19/16542* (2013.01); *G01R 31/3658* (2013.01); *H03F 2203/45514* (2013.01); *H03F 2203/45551* (2013.01)

(58) Field of Classification Search
CPC ..... H02J 7/0091; H02J 7/0081; H02J 7/0029; H02J 7/0073; H02J 7/0083; H02J 7/008; H01M 10/44; Y02E 60/12; Y02B 40/90
USPC ....................................................... 324/429
See application file for complete search history.

(56) References Cited

U.S. PATENT DOCUMENTS

| 4,906,055 | A | * | 3/1990 | Horiuchi ........................... 327/77 |
| 5,166,549 | A | * | 11/1992 | DeDoncker ...................... 327/79 |
| 5,477,124 | A | * | 12/1995 | Tamai ............................. 320/135 |
| 5,519,563 | A | * | 5/1996 | Higashijima et al. ........... 361/16 |
| 6,700,383 | B2 | * | 3/2004 | Kimura et al. .................. 324/429 |
| 8,330,469 | B2 | * | 12/2012 | Miyamoto ....................... 324/433 |
| 8,570,047 | B1 | * | 10/2013 | Davies et al. ................... 324/434 |
| 2001/0054887 | A1 | * | 12/2001 | Baretich et al. ................. 323/284 |
| 2008/0129253 | A1 | * | 6/2008 | Shiue et al. ..................... 320/167 |
| 2009/0302816 | A1 | * | 12/2009 | Kunimatsu ...................... 323/282 |
| 2010/0079204 | A1 | | 4/2010 | Ummelmann |
| 2012/0007567 | A1 | * | 1/2012 | Disney et al. ................... 320/166 |
| 2012/0176097 | A1 | * | 7/2012 | Takezawa et al. .............. 320/134 |

FOREIGN PATENT DOCUMENTS

WO          96/10827 A1     4/1996

OTHER PUBLICATIONS

Partial European Search Report issued in EP Application No. 12003032.5 dated Jan. 21, 2013.
Extended European Search Report issued in EP Application No. 12003032.5, entitled "Switched Capacitance Voltage Differential Sensing Circuit with Near Infinite Input Impedance," dated Jun. 14, 2013.

* cited by examiner

*Primary Examiner* — Arun Williams
(74) *Attorney, Agent, or Firm* — McDermott Will & Emery LLP

(57) ABSTRACT

A circuit may sense the differential voltage across two nodes that each have a non-zero common mode voltage. The circuit may have a positive input impedance that is imposed across the nodes. An impedance compensation circuit may generate a compensation current that is delivered to the nodes that substantially cancels the loading effect of the positive input impedance. The impedance compensation circuit may generate a negative input impedance that is imposed across the two nodes that is substantially the same as the positive input impedance. The impedance compensation circuit may instead be configured to deliver the compensation current to the nodes.

21 Claims, 9 Drawing Sheets

SWITCHED CAPACITANCE VOLTAGE DIFFERENTIAL SENSING CIRCUIT WITH NEAR INFINITE INPUT IMPEDANCE

CROSS-REFERENCE TO RELATED APPLICATION

This application is based upon and claims priority to U.S. provisional patent application 61/480,915, entitled "Maximizing Input Impedance In Switched Capacitor Circuits," filed Apr. 29, 2011. The entire content of this application is incorporated herein by reference.

BACKGROUND

1. Technical Field

This disclosure relates to voltage sensing circuits, including voltage sensing circuits that measure differential voltages across high impedance nodes with high common mode voltages.

2. Description of Related Art

Sensing the voltage across two nodes with a high common mode voltage can be challenging. The challenges can include isolating the high common mode voltage from as many components in the circuit as possible to minimize circuit size and to maximize performance; minimizing the load imposed by the sensing circuit on the nodes to be sensed, particularly when the nodes have a high source impedance, such as when they are at the output of an RC noise filtering circuit; and minimizing the noise generated by the voltage sensing circuit to maximize accuracy. Achieving all of these goals simultaneously can be particularly challenging.

SUMMARY

A voltage sensing circuit may sense a differential voltage across two nodes that each have a non-zero common mode voltage. The voltage sensing circuit may include a voltage differential sensing circuit configured to sense the differential voltage across the two nodes that each have the non-zero common mode voltage. The voltage differential sensing circuit may have a positive input impedance that is imposed across the nodes when the voltage sensing circuit is connected to the nodes. The voltage sensing circuit may also include an impedance compensation circuit configured to generate a compensation current that is delivered to at least one of the nodes that substantially cancels the loading effect of the positive input impedance on the two nodes.

The impedance compensation circuit may be configured to generate a negative input impedance that is imposed across the two nodes when the voltage sensing circuit is connected to the two nodes. The negative input impedance may be substantially the same as the positive input impedance imposed by the voltage differential sensing circuit.

The impedance compensation circuit may instead be configured to deliver the compensation current to the two nodes.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

There may be a need to accurately measure a small differential voltage across a set of nodes that have a large common mode voltage. For example, there may be a need to accurately measure the voltage of one battery cell that is connected in a large series of battery cells. The large common mode voltage should not interfere with the accuracy of the measurement.

Figure 1:
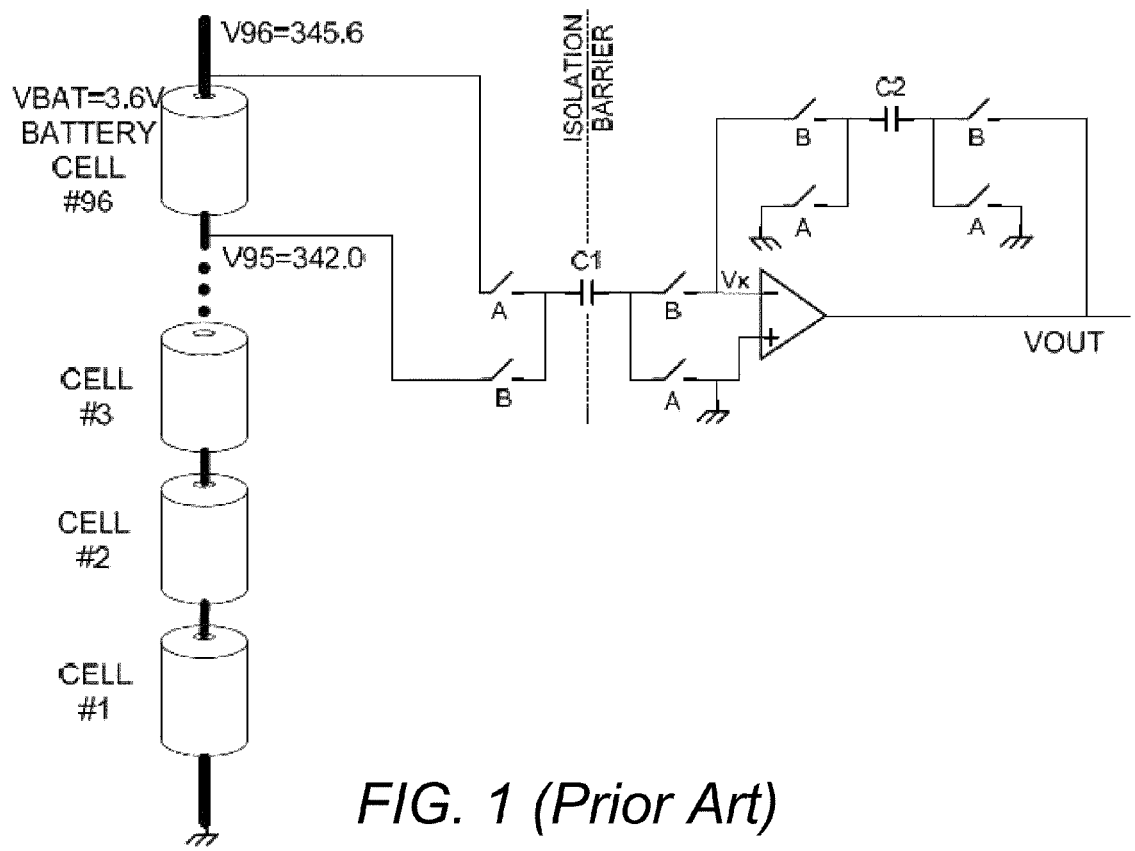
FIG. 1 illustrates an example of a prior art voltage sensing circuit that sensed a differential voltage across two nodes that each have a high, non-zero common mode voltage.

FIG. 1 illustrates an example of a prior art voltage sensing circuit that sensed a differential voltage across two nodes that each have a high, non-zero common mode voltage. As illustrated in FIG. 1, the voltage sensing circuit contained electronic switches A and B, capacitors C1 and C2, and an inverting amplifier connected across the terminals of a battery cell that itself was one in a large set of battery cells that were serially connected.

Figure 2:
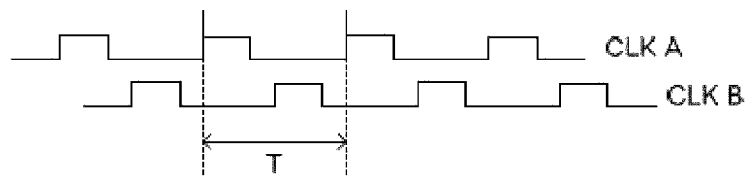
FIG. 2 illustrates an example of prior art quadrature, non-overlapping clocks that were used to control the prior art voltage sensing circuit illustrated in FIG. 1.

FIG. 2 illustrates an example of prior art quadrature, non-overlapping clocks that were used to control the prior art voltage sensing circuit illustrated in FIG. 1. The electronic switches A and B illustrated in FIG. 1 were driven by the quadrature, non-overlapping clocks CLK A and CLK B, respectively, illustrated in FIG. 2. The switches were configured to close when their respective clock was high and open when their respective clock was low.

The periodic opening and closing of the switches A and B moved charge between the battery cell and the capacitors. When averaged for several clock periods (T), this periodic charge transfer resembled a current of magnitude I=dQ/dT. This is a principle by which switched capacitor circuits operate.

Charge transfer equations are now presented that illustrate that the circuit in FIG. 1 amplified the 3.6V battery voltage, while rejecting the 342V common mode voltage. An "A" phase in these equations was when CLK A was high, and a "B" phase in these equations indicates when CLK B was high.

During the A phase, the charge on capacitors C1 and C2 is given by:

$QC1A=C1*(354.6-0)$ (Eq. 1A)

$QC2A=C2*(0-0)$ (Eq. 1B)

During the B phase, the charge on the capacitors becomes:

$QC1B=C1*(342.0-Vx)$ (Eq. 2A)

$QC2B=C2*(VOUTB-Vx)$ (Eq. 2B)

The inverting amplifier forced the signal Vx to be the same as ground (0V) during the B phase by way of negative feedback through C2. So Equations 2A and 2B can be rewritten as:

$QC1B=C1*(342.0-0)$ (Eq. 3A)

$QC2B=C2*(VOUTB-0)$ (Eq. 3B)

Kirchhoff's current law states that the sum of the currents into a node is zero. This law applies to switched capacitor circuits. The change in charge on a capacitor in one clock period is the same as the average current flowing through that capacitor. Therefore the sum of charges into node Vx over a clock period T must be zero:

$[QC1A-QC1B]+[QC2A-QC2B]=0$ (Eq. 4)

Substituting Equations 1A, 1B, 3A, and 3B into Equation 4 results in:

$C1*(354.6-342)+C2*(-VOUTB)=0$ (Eq. 5)

Solving for VOUTB (the signal VOUT during the B phase), the output of the switched capacitor circuit becomes an amplified version of the 3.6V battery cell voltage and the 342V common mode voltage has been rejected by the circuit:

$VOUTB=C1/C2*(3.6)$ or, in general $VOUTB=C1/C2*VBAT$ (Eq. 6)

The circuit in FIG. 1 could be the first stage of an analog-to-digital converter. Those skilled in the art will recognize that error sources like the offset voltage of the inverting amplifier can be corrected and that a digital value corresponding to the battery cell voltage can be obtained. Although the absolute values of C1 and C2 may vary, their ratio may be tightly controlled when constructed on an integrated circuit.

The switched capacitor circuit in FIG. 1 may have advantages over other circuits. The capacitor C1 forms an "isolation barrier" between the signal source, i.e. the battery, and the amplifying circuit, as reflected by the dashed line in FIG. 1. The components to the left of the isolation barrier are exposed to high voltage. Therefore, these components may need to be very large and can be very slow. Components to the right of the isolation barrier are only exposed to low voltages and therefore can be much smaller and faster. Minimizing the number of high voltage components can minimize the size of the circuit and can improve its speed.

Figure 3A:
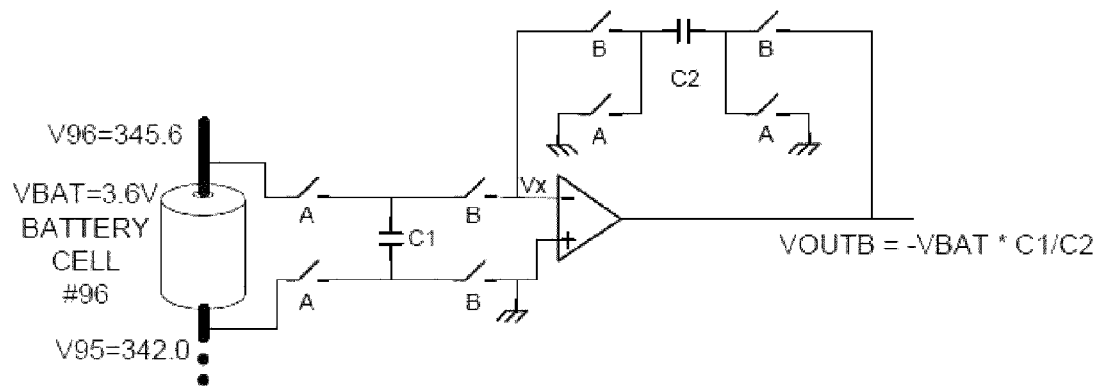
FIGS. 3A and 3B illustrate other examples of prior art voltage sensing circuits that sense a differential voltage across two nodes that each have a high, non-zero common mode voltage.
Figure 3B:
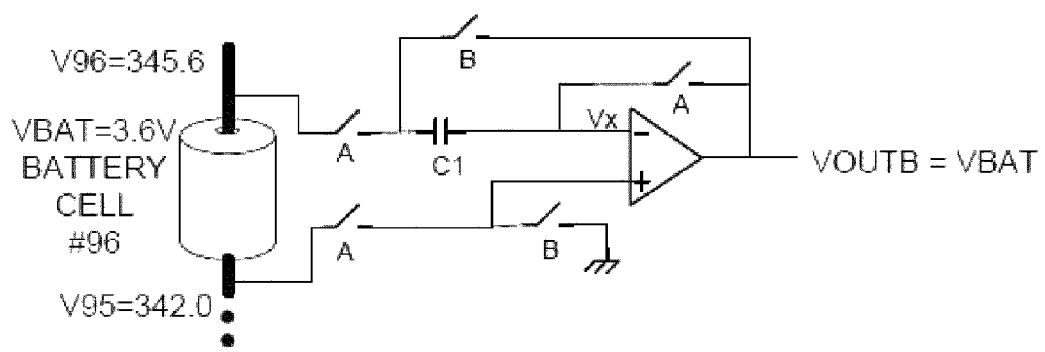

FIGS. 3A and 3B illustrate other examples of prior art voltage sensing circuits that sense a differential voltage across two nodes that each have a high, non-zero common mode voltage. These circuits may not be as suitable for measurements of nodes that have a large common high voltage because more circuit elements are exposed to the common mode high voltage. This can require these other components to be larger and slower than the corresponding ones illustrated in FIG. 1.

Figure 4:
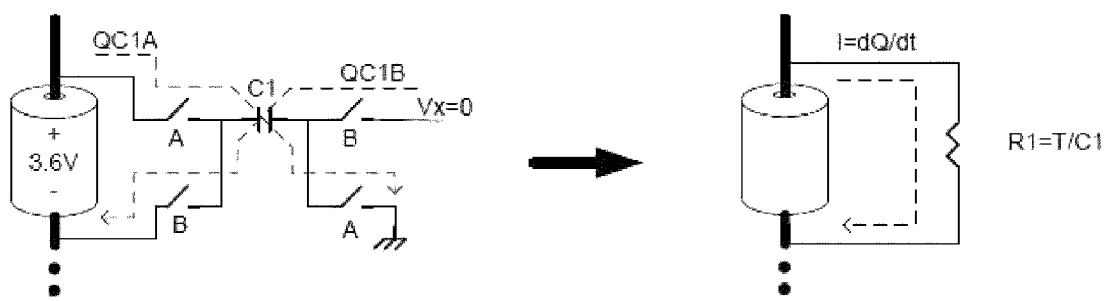
FIG. 4 illustrates the charge change through C1 in FIG. 1.

FIG. 4 illustrates the charge change through C1 in FIG. 1. The operation of a switched capacitor can resemble a resistor. The switched capacitor C1 has an equivalent impedance given by:

Charge change in 1 clock period=$QC1A-QC1B=3.6V*C1=VBAT*C1$ (Eq. 7A)

Equivalent current=Charge change/Time=$3.6V*C1/T=VBAT*C1/T$ (Eq. 7B)

Equivalent impedance=Voltage/Current=$VBAT/VBAT*T/C1=T/C1$ (Eq. 7C)

The equivalent impedance R1 of the circuit has a thermal noise power, NR1, which may be approximated by:

$NR1=k*Te/C1$ (Eq. 8)

where k is Boltzman's constant and Te is temperature in degrees Kelvin.

Therefore, decreasing the value of C1 may increase the equivalent impedance of the circuit and simultaneously increase the noise of the circuit.

Figure 5:
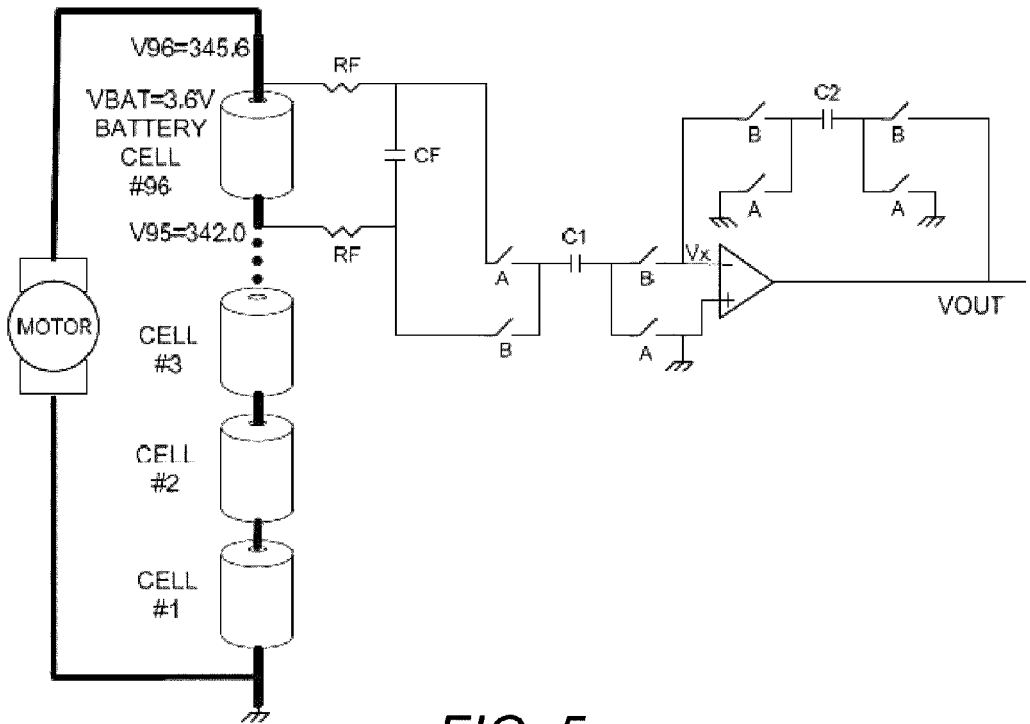
FIG. 5 illustrates an example of the prior art voltage sensing circuit illustrated in FIG. 1, but connected across two nodes that each have a high, non-zero common mode voltage and a high source impedance.

FIG. 5 illustrates an example of the prior art voltage sensing circuit illustrated in FIG. 1, but connected across two nodes that each have a high, non-zero common mode voltage and a high source impedance. As illustrated in FIG. 5, the switched capacitor circuit may be used to measure a signal with a high source impedance.

In FIG. 5, the stack of battery cells may power a motor. The switching action of the motor may create voltage transients in the battery. These transients may interfere with the accurate measurement of VBAT. A low pass filter has therefore been added between the battery and the switched capacitor circuit. The low pass filter, including resistors RF and capacitor CF, may attenuate voltage transients created by the motor and improve the accuracy of the VBAT measurement. However, the input impedance R1 of the switched capacitor circuit with the filter resistors RF may interact causing the voltage of the battery to be attenuated, causing Equation 6 to no longer be valid. The new equation for VOUT may now depend on the absolute values of RF and CF as follows:

$$VOUTB = \frac{C1}{C2} * VBAT * \left[1 - \frac{C1 * e^{\frac{-T}{4*RF*CF}}}{C1 + CF\left(1 - e^{\frac{-T}{2*RF*CF}}\right)}\right]$$ (Eq. 9)

The absolute values of RF and CF may not be well controlled, so the value of VOUT may be difficult to accurately predict. This can be unacceptable when the goal is a precise measurement of battery cell voltage.

When the value of CF is large, Equation 9 reduces to:

$$VOUTB = \frac{C1}{C2} * VBAT * \left[\frac{T/C1}{2*RF*T/C1}\right]$$ (Eq. 10)

There can be an error in the value of VOUT that is directly proportional to the absolute value of RF, T, and C1.

The filtering of the unwanted motor noise may be proportional to the product RF*CF. To reduce the error described in Equation 10, the value of RF could be reduced and CF increased. However, this may lead to an unacceptably large value of CF.

Another solution may be to reduce the values of C1 and C2, while maintaining the same ratio C1/C2. This may reduce the error term in Equation 10. However, the noise of the circuit may increase, as described in Equation 8.

What would be helpful is to raise the input impedance of the switched capacitor circuit without increasing the noise of the circuit, and without sacrificing the common mode rejection of the circuit.

Figure 6:
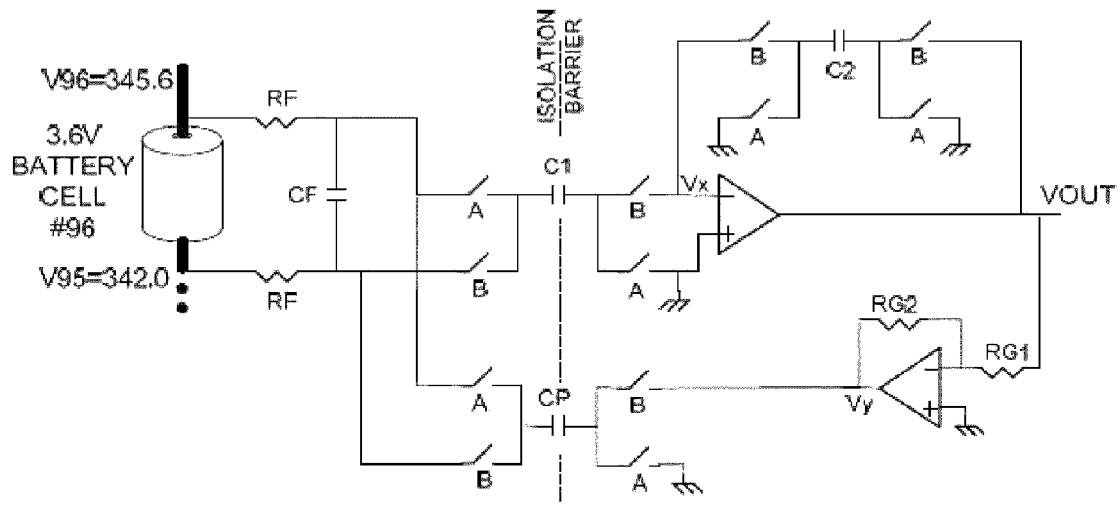
FIG. 6 illustrates an example of a voltage sensing circuit that senses a differential voltage across two nodes that each have a high, non-zero common mode voltage and that includes an impedance compensation circuit.

FIG. 6 illustrates an example of a voltage sensing circuit that senses a differential voltage across two nodes that each have a high, non-zero common mode voltage and that includes an impedance compensation circuit. The circuit is the same as the one illustrated in FIG. 5, except that an impedance compensation circuit has been added below which includes lower electronic switches A and B, a capacitor CP, a second inverting amplifier, and resisters RG1 and RG2.

The effect of this impedance compensation circuit is to cancel the effect of impedance R1 by adding a parallel impedance RP, such that RP=−R1. When these two impedances are placed in parallel, the combination is a new impedance, R1NEW, with a value $$R1NEW = R1*RP/(R1+RP) = -R1*R1/(R1-R1) = \infty \quad \text{(Eq. 11)}$$

Since the effective impedance of the switched capacitor circuit illustrated in FIG. 6 is now essentially infinite, there is essentially no interaction with RF. The gain is once again simply VOUTB=C1/C2*VBAT.

Neither the noise nor the common mode rejection may be adversely effected by the addition of the parallel impedance RP. The inverting amplifier and the switched capacitor CP create the impedance RP. Proper selection of the ratios RG2/RG1 and CP/C1 can therefore create a near infinite input impedance.

The charge change in one clock period for capacitor CP is given by:

$$QCPA - QCPB = CP*(345.6 - VOUTA) - CP*(342.0 - VyB) = CP*VBAT + CP*(VyB - VOUTA) \quad \text{(Eq. 12A)}$$

$$VyB = -RG2/RG1*VOUTB = -RG2/RG1*C1/C2*VBAT \quad \text{(Eq. 12B)}$$

$$VOUTA = VOUTB \quad \text{(Eq. 12BB)}$$

Therefore:

$$QCPA - QCPB = CP*VBAT*(1 - C1/C2 - C1/C2*RG2/RG1) \quad \text{(Eq. 12C)}$$

To achieve a near infinite input impedance, the charge change in CP must exactly cancel the charge change in C1 so that the net charge from the VBAT to the switched capacitor circuit is zero:

$$(QC1A - QC1B) + (QCPA - QCPB) = 0 \quad \text{(Eq. 13)}$$

Combining Equation 7, Equation 12, and Equation 13:

$$(VBAT*C1) + (CP*VBAT*(1 - C1/C2 - C1/C2*RG2/RG1)) = 0 \quad \text{(Eq. 14A)}$$

$$C1/CP = C1/C2*(1 + RG2/RG1) - 1 \quad \text{(Eq. 14B)}$$

$$CP/C1 = (C2/C1)/(RG2/RG1 + 1 - C2/C1) \quad \text{(Eq. 14C)}$$

$$CP = C2/(RG2/RG1 + 1 - C2/C1) \quad \text{(Eq. 14D)}$$

Equation 14A-14D imply that, for any given values of C1 and C2, the values of RG1, RG2, and CP can be chose to create an almost infinite input impedance.

If the input impedance of the switched capacitor circuit in FIG. 6 is essentially infinite, essentially no DC current will flow through resistors RF. Therefore, the voltage across capacitor CF will be the same as the battery cell voltage. The addition of the negative impedance circuit does not alter the expression for VOUT given in Equation 6. Therefore FIG. 6 can maintain the precision, common mode rejection, and isolation barrier of the circuit in FIG. 1, while providing noise filtering from components RF and CF.

Components RG1 and RG2 can be implemented as switched capacitors CRG1 and CRG2. Furthermore, the circuit can be made "fully differential." This can provide the additional benefit of enhanced power supply rejection.

Figure 7:
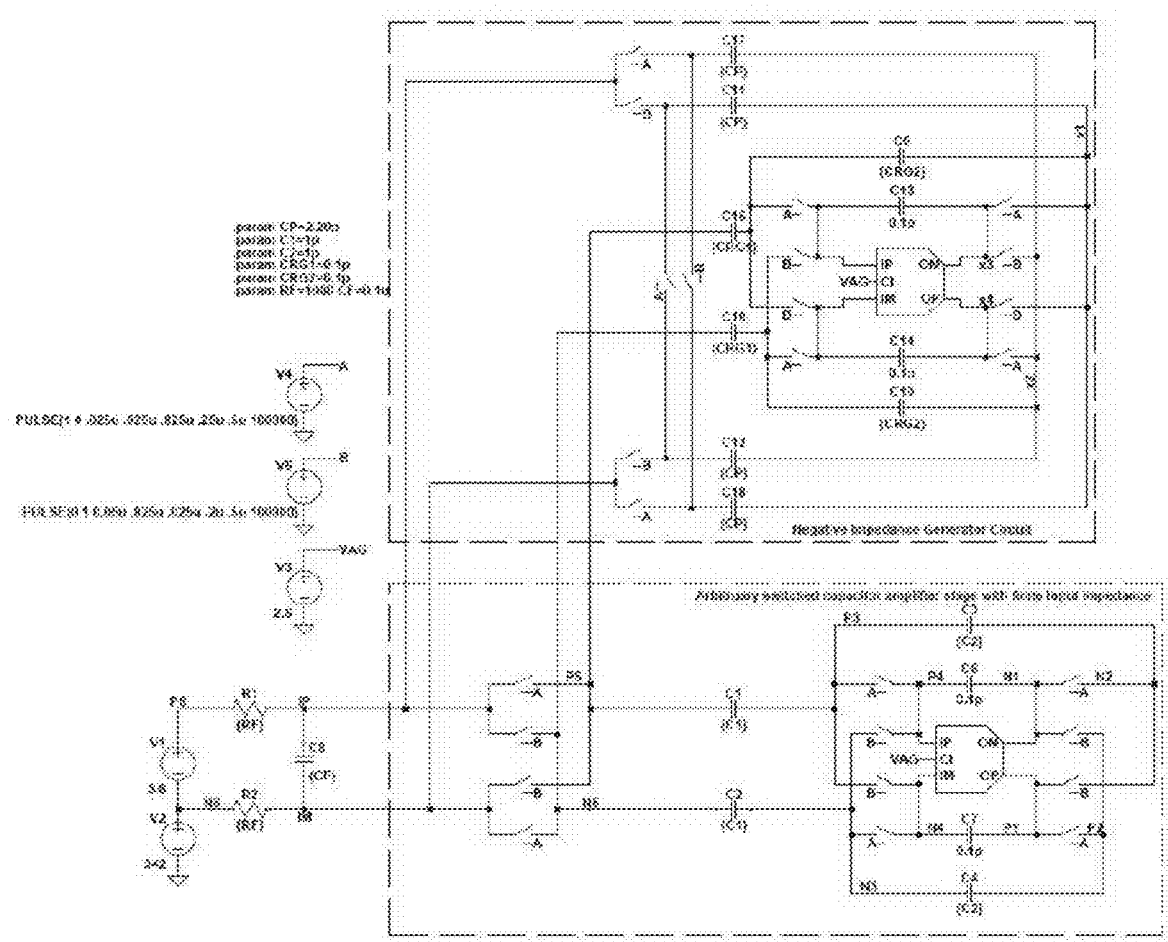
FIG. 7 illustrates another example of a voltage sensing circuit that senses a differential voltage across two nodes that each have a high, non-zero common mode voltage and that includes an impedance compensation circuit.

FIG. 7 illustrates another example of a voltage sensing circuit that senses a differential voltage across two nodes that each have a high, non-zero common mode voltage and that includes an impedance compensation circuit. FIG. 7 also illustrates a practical implementation of the circuit shown in FIG. 6. The {values} in the schematic correspond to the components named in FIG. 6.

Figure 8:
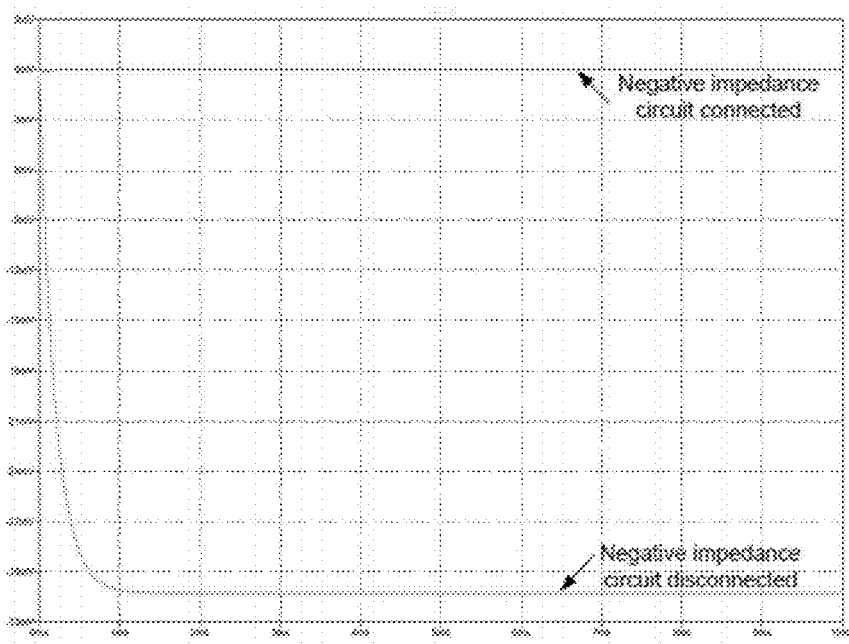
FIG. 8 illustrates a graph of results of a simulation of the circuit illustrated in FIG. 7.

FIG. 8 illustrates a graph of results of a simulation of the circuit illustrated in FIG. 7. The graph illustrates a 31 mV measurement error (~1%) when the negative impedance circuit is disconnected and no error (ideally) when the negative impedance circuit is connected. The actual error of the circuit depends on the matching of the capacitors, which can be very good when constructed on an integrated circuit.

FIGS. 9-13 illustrate other examples of a voltage sensing circuit that senses a differential voltage across two nodes that each have a high, non-zero common mode voltage and that includes an impedance compensation circuit.

Figure 9:
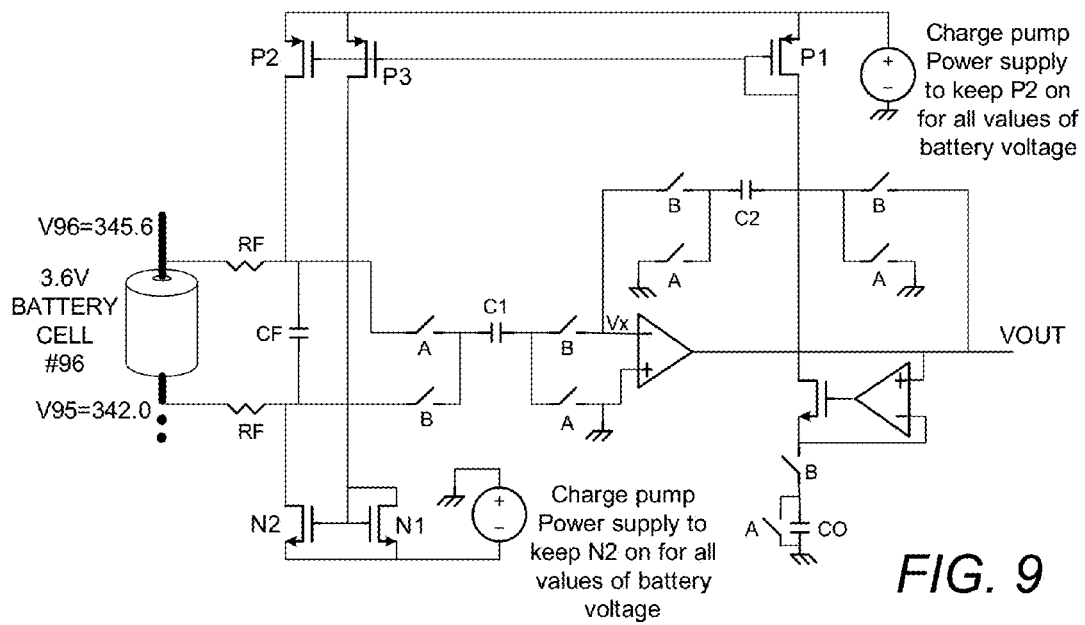
FIGS. 9-13 illustrate other examples of a voltage sensing circuit that senses a differential voltage across two nodes that each have a high, non-zero common mode voltage and that includes an impedance compensation circuit.

As illustrated in FIG. 9, a current proportional to VOUT (and therefore VIN) is generated by switched capacitor C0. This current transfers back to the inputs through several current mirrors, canceling the current due to the input impedance of the switched capacitor circuit. Several charge pump power supplies are provided so the circuit can work over a wide range of input voltages.

The relationship between C0, C1, and CF may be as follows:

$$\text{Charge Change in 1 clock period for } C0 = QC0A - QC0B = -C0*VOUTB \quad \text{(Eq. 15A)}$$

The charge may be transferred to one input through current mirror P1 & P2. The charge is transferred to the other input through P1, P3, N1, and N2. To achieve a near infinite input impedance, the charge change in C0 may exactly cancel the charge change in C1 so that the net charge from the VBAT to the switched capacitor circuit is zero. Summing charge at either node:

$$(QC0A - QC0B) + (QC1A - QC1B) = 0 \quad \text{(Eq. 15B)}$$

Combining Equations 6, 7, and 15:

$$VBAT*C1 - C0*(C1/C2)*VBAT = 0 \quad \text{(Eq. 16A)}$$

$$C0 = C2 \quad \text{(Eq 16B)}$$

Figure 10:
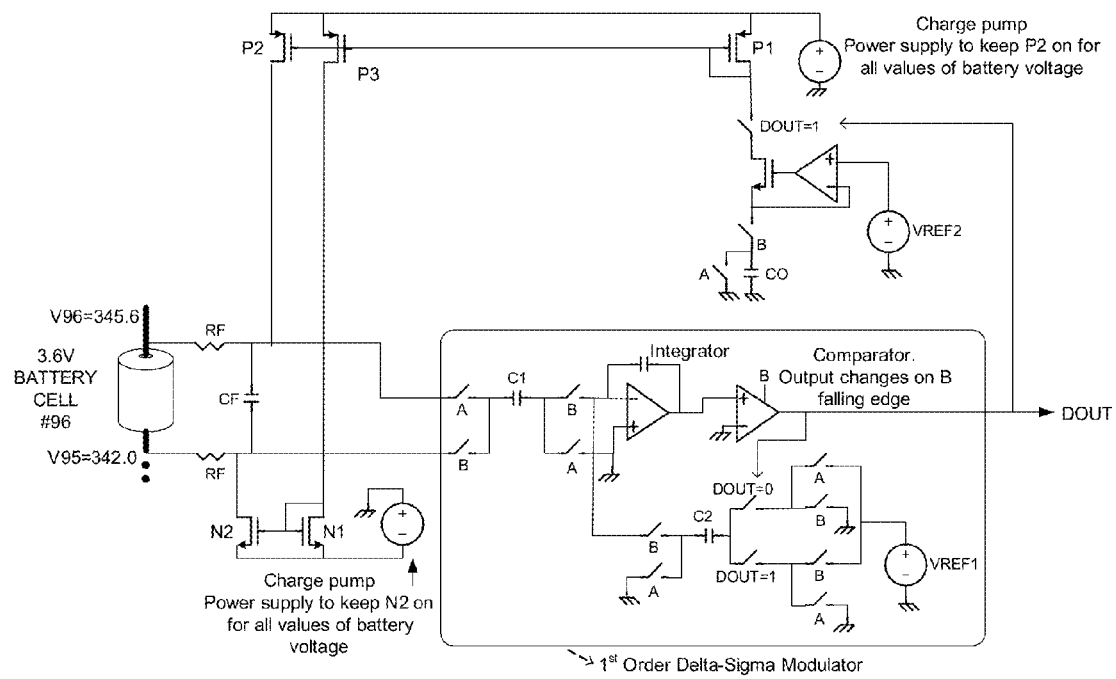

In FIG. 10, a digital signal DOUT is generated by a delta-sigma modulator. The signal DOUT may be a sequence of 1's and 0's. The percentage of 1's may be proportional to the voltage VBAT. The DOUT signal may be used to control the amount of charge transferred to the input through the current mirrors. If the percentage of 1's in DOUT is related to the input voltage VBAT by the constant K:

$$DOUT\% = K*VBAT$$

Then the value of C0 may exactly cancel the current in C1 and may be given by:

$C0 = K*C1/VREF2$

In summary, a negative impedance can be generated and placed in parallel with the positive input impedance of a differential voltage measuring circuit. The two impedances can effectively cancel each other, creating an essentially infinite impedance, which can be highly beneficial. The additional circuitry may not increase the noise of the circuit.

The noise and the input impedance of FIG. 5 may be closely related. Assuming the noise at VOUT is primarily due to C1 and C2, and for simplicity C1=C2, using equation 8 the noise at VOUT may be given by:

$$NOUT = NR1 + NR2 = 2*NR1 = 2*k*Te/C1 \quad (Eq\ 17)$$

with units Volts Squared ($V^2$)

The input impedance of FIG. 5 may be given by Equation 7C. Since a goal of this circuit may be to raise the input impedance without increasing the noise, a figure of merit for the circuit may be the ratio of the noise to impedance, a quantity which may be minimized. For FIG. 5, this ratio S may be given by:

$$S = NOUT/\text{impedance} = (2*k*Te/C1)/(T/C1) = 2*k*Te/T \quad (Eq\ 18)$$

with units Watts (W)

Equation 18 may be independent of C1. This means if C1 is decreased by 10× to raise the input impedance 10×, the noise power NOUT may also increase by 10×. In a practical circuit with a 1 usec clock period (T) operating at room temperature (Te=300K) Equation 18 may have a numerical value of S=8.332E−15. W The circuits of FIG. 6, FIG. 9, and FIG. 10 may raise the input impedance without significantly changing the noise. For a practical circuit, operating a room with a 1 usec clock period, the figure of merit S may be improved to S'<8.332E−16. W The sampling switches and capacitors can be arranged such that an isolation barrier is created by the sampling capacitors. The circuit topology may minimize the number of devices on the "high voltage" side of the barrier. Thus, a smaller and faster circuit can result.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

Figure 11:
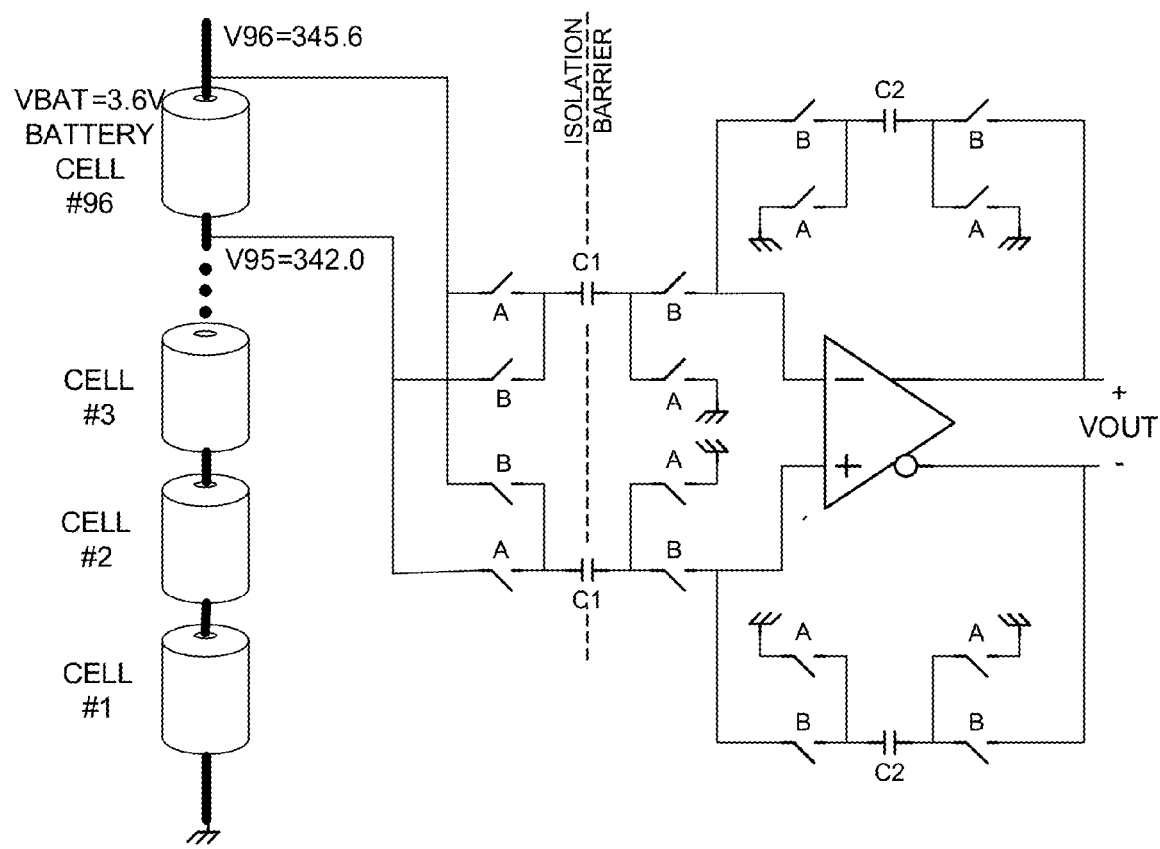
Figure 12:
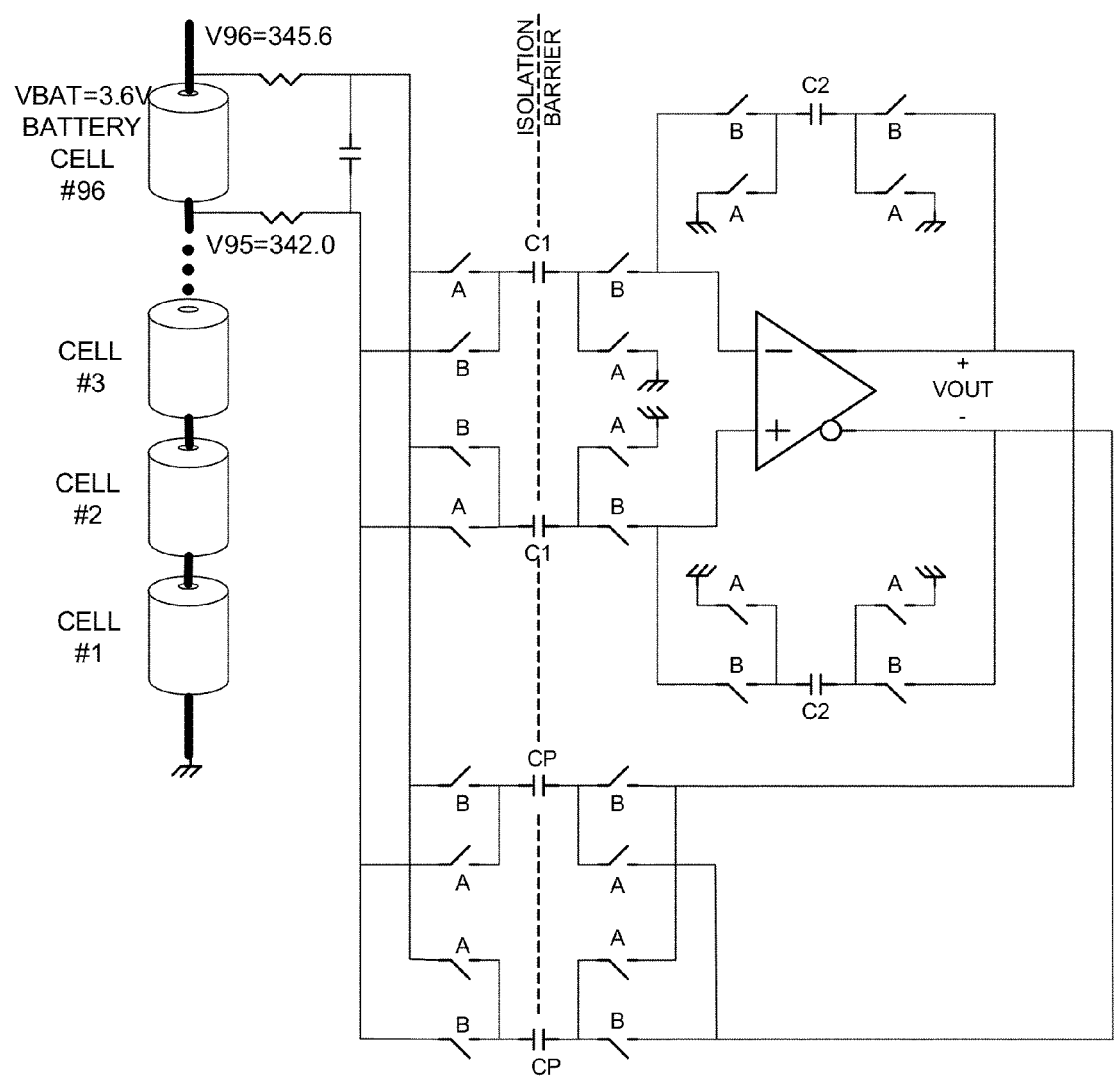

For example
the voltage sensing circuits may be made fully differential by adding switches, capacitors, and by using a differential output amplifier, as shown in FIG. 11. The fully differential sensing circuit may simplify the implementation of the impedance compensating circuit because the inverting amplifier stage may not be necessary, as illustrated in FIG. 12.

Figure 13:
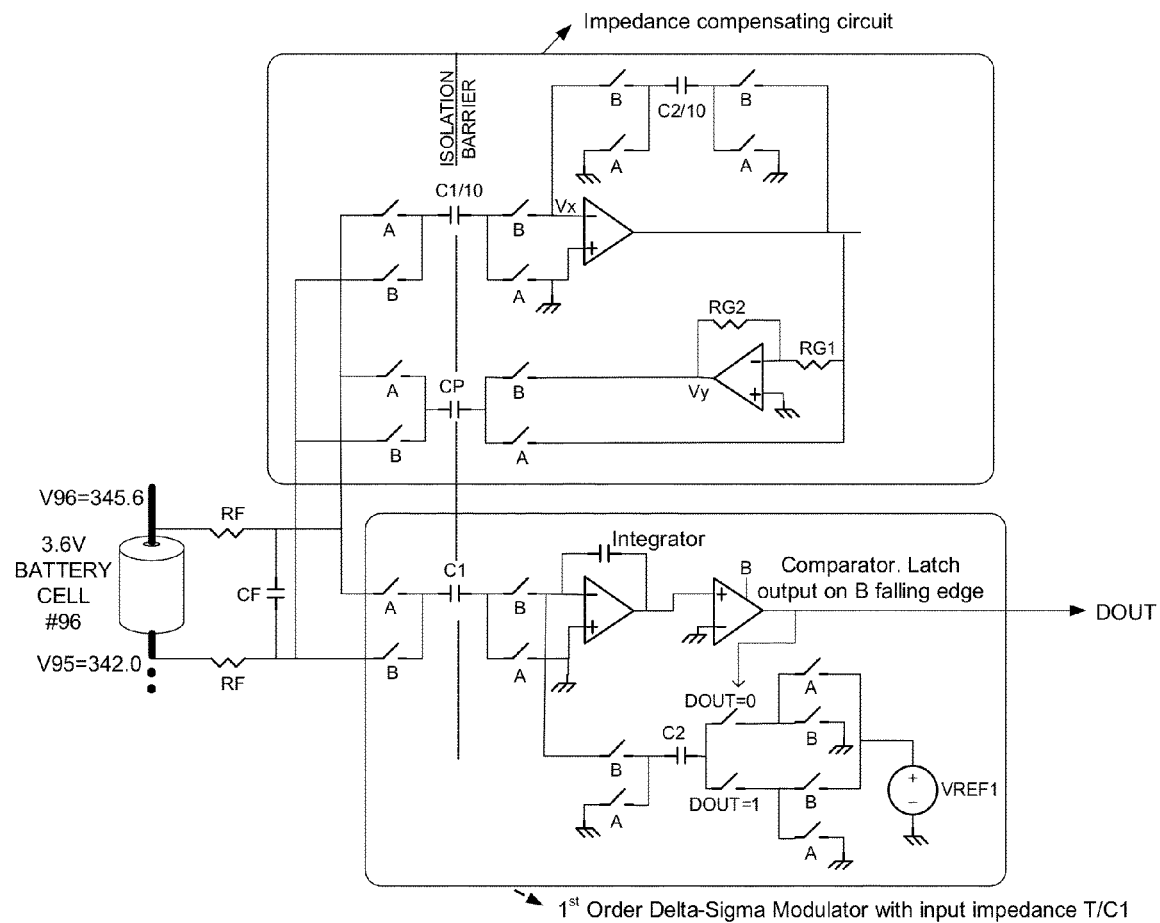

The voltage sensing circuit may be part of a larger function, such as a delta-sigma modulator. Amplifiers may be added to completely separate the voltage sensing circuit from the impedance compensation function. An example of this is illustrated in FIG. 13. The circuit in FIG. 13 is drawn as a "single-ended" circuit for simplicity. It can be converted to a fully differential circuit in the same manner as in FIG. 11. FIGS. 11 and 12 and variations of these circuits may have a value for CP which results in near infinite impedance, the equation for CP being derivable from the topology of the circuit.

Unless otherwise stated, all measurements, values, ratings, positions, magnitudes, sizes, and other specifications that are set forth in this specification, including in the claims that follow, are approximate, merely examples, and not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases in a claim mean that the claim is not intended to and should not be interpreted to be limited to these corresponding structures, materials, or acts or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as first and second and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A voltage sensing circuit for sensing a differential voltage across two nodes that each have a non-zero common mode voltage, the voltage sensing circuit comprising:

a voltage differential sensing circuit configured to sense the differential voltage across the two nodes that each have the non-zero common mode voltage, the voltage differential sensing circuit having a positive input impedance that is imposed across the nodes when the voltage sensing circuit is connected to the nodes; and an impedance compensation circuit configured to generate a compensation current that is delivered to the two nodes that substantially cancels the loading effect of the positive input impedance on the two nodes.

2. The voltage sensing circuit of claim 1 wherein the impedance compensation circuit is configured to generate a negative input impedance that is imposed across the two nodes when the voltage sensing circuit is connected to the two nodes and that is substantially the same as the positive input impedance imposed by the voltage differential sensing circuit.

3. The voltage sensing circuit of claim 2 wherein the voltage differential sensing circuit includes a first capacitance through which the voltage differential sensing circuit is configured to be connected to the nodes.

4. The voltage sensing circuit of claim 3 wherein the voltage differential sensing circuit includes a first electronic switch configured to be connected between the capacitance and one of the nodes and a second electronic switch separate from the first electronic switch configured to be connected between the capacitance and the other node.

5. The voltage sensing circuit of claim 4 wherein the voltage differential sensing circuit does not include any electrical components that are configured to be connected between the capacitance and the two nodes, other than the electrical switches.

6. The voltage sensing circuit of claim 2 wherein the impedance compensation circuit includes a first capacitance through which the impedance compensation circuit is configured to be connected to the nodes.

7. The voltage sensing circuit of claim 6 wherein the impedance compensation circuit includes a first electronic switch configured to be connected between the capacitance and one of the nodes and a second electronic switch separate from the first electronic switch configured to be connected between the capacitance and the other node.

8. The voltage sensing circuit of claim 7 wherein the impedance compensation circuit does not include any electrical components that are configured to be connected between the capacitances and the two nodes, other than the electrical switches.

9. The voltage sensing circuit of claim 2 wherein the voltage differential sensing circuit and the impedance compensation circuit are configured to be connected to the two nodes in parallel.

10. The voltage sensing circuit of claim 1 wherein the impedance compensation circuit is configured to deliver the compensation current to the nodes.

11. The voltage sensing circuit of claim 10 wherein the impedance compensation circuit includes a switched capacitance.

12. The voltage sensing circuit of claim 10 wherein the impedance compensation circuit is configured to generate the compensation current based on an output from the voltage differential sensing circuit.

13. The voltage sensing circuit of claim 1 wherein the auxiliary circuit is configured to cause the input impedance of the voltage sensing circuit to be nearly infinite.

14. The voltage sensing circuit of claim 13 wherein the voltage sensing circuit has a ratio of noise level to input impedance that is no greater than 8.332E-16 W when operating at 300 degrees Kelvin with a 1 usec sampling clock period.

15. The voltage sensing circuit of claim 1 further comprising a clock circuit.

16. The voltage sensing circuit of claim 1 wherein the clock circuit is configured to generate two non-overlapping quadrature clocks.

17. The voltage sensing circuit of claim 1 wherein the impedance compensation circuit is configured to generate the compensation current based on an output from the voltage differential sensing circuit.

18. The voltage sensing circuit of claim 1 wherein the impedance compensation circuit is configured to generate the compensation current that is not based on an output from the voltage differential sensing circuit.

19. A voltage sensing system for sensing a differential voltage across two nodes that each have a non-zero common mode voltage, the voltage sensing system including a voltage sensing circuit and capacitors that D.C. isolate the two nodes from the voltage sensing circuit an impedance compensation circuit configured to generate a compensation current that is delivered to the two nodes that substantially cancels the loading effect and that and imposes a near infinite D.C. impedance on each of the nodes.

20. The voltage sensing system of claim 19 wherein the voltage sensing system is configured in a way that the ratio of noise level to input impedance is no greater than 8.332E-16 W when operating at 300 degrees Kelvin with a 1 usec sampling clock period.

21. The voltage sensing system of claim 19 wherein the capacitors D.C. isolate the two nodes from the voltage sensing circuit at all times during operation of the voltage sensing system.

* * * * *